(12) United States Patent
Zander et al.

(10) Patent No.: US 8,494,815 B2
(45) Date of Patent: Jul. 23, 2013

(54) METHOD OF DESIGNING A SOUND WAVEGUIDE SURFACE

(75) Inventors: Anthony Charles Zander, North Adelaide (AU); David John Murphy, Henley Beach (AU); Richard Christie Morgans, Kilburn (AU); Colin Henry Hansen, Marion (AU)

(73) Assignee: Krix Loudspeakers Pty Ltd, Hackham, South Australia (AU)

( * ) Notice: Subject to any disclaimer, the term of this patent is extended or adjusted under 35 U.S.C. 154(b) by 0 days.

(21) Appl. No.: 12/932,527

(22) Filed: Feb. 28, 2011

(65) Prior Publication Data

US 2011/0153282 A1  Jun. 23, 2011

Related U.S. Application Data

(63) Continuation of application No. 11/899,056, filed on Sep. 4, 2007, now abandoned.

(30) Foreign Application Priority Data

Sep. 4, 2006  (AU) ................................ 2006904810

(51) Int. Cl.
| | | |
|---|---|---|
| *G06F 17/50* | (2006.01) | |
| *G06G 7/56* | (2006.01) | |
| *G01V 1/00* | (2006.01) | |
| *G01S 3/80* | (2006.01) | |

(52) U.S. Cl.
USPC .......... 703/1; 703/5; 367/61; 367/65; 367/119

(58) Field of Classification Search
USPC ................................. 703/5, 1; 367/61, 65, 119
See application file for complete search history.

(56) References Cited

U.S. PATENT DOCUMENTS

| | | | | |
|---|---|---|---|---|
| 4,071,112 | A | * | 1/1978 | Keele, Jr. ...................... 181/187 |
| 4,187,926 | A | | 2/1980 | Henricksen et al. |
| 4,308,932 | A | | 1/1982 | Kelle, Jr. |
| 4,465,160 | A | | 8/1984 | Kawamura et al. |
| 4,580,655 | A | | 4/1986 | Keele, Jr. |
| 4,685,532 | A | | 8/1987 | Gunness |
| 5,020,630 | A | | 6/1991 | Gunness |
| 6,059,069 | A | | 5/2000 | Hughes, II |
| 6,411,263 | B1 | * | 6/2002 | Neilson ......................... 343/786 |
| 6,466,680 | B1 | * | 10/2002 | Gelow et al. .................. 381/340 |
| 6,513,622 | B1 | * | 2/2003 | Gelow et al. .................. 181/152 |
| 7,068,805 | B2 | | 6/2006 | Geddes |
| 7,467,071 | B2 | * | 12/2008 | Manrique ........................ 703/2 |

(Continued)

OTHER PUBLICATIONS

Lucci, "Phase Centre Optimization in Profiles Corrugated Circular Horns With Parallel Genetic Algorithms", 2004.*

(Continued)

*Primary Examiner* — Omar Fernandez Rivas
*Assistant Examiner* — Angel Calle
(74) *Attorney, Agent, or Firm* — Klauber & Jackson LLC

(57) ABSTRACT

A method for designing a sound waveguide surface is described. The method includes the steps of forming a parametric model of the sound waveguide surface where the parametric model has at least one input parameter and then simulating a sound field that is formed by the sound waveguide surface. A frequency dependent spatial distribution measure is then determined for the sound field associated with the sound waveguide surface and the at least one input parameter is varied to change the sound waveguide surface to adjust the value of the frequency dependent spatial distribution measure.

20 Claims, 7 Drawing Sheets

U.S. PATENT DOCUMENTS

2002/0150270 A1*  10/2002  Werner  ............. 381/342
2003/0133584 A1*  7/2003   Werner  ............. 381/338
2005/0175208 A1*  8/2005   Shaw et al.  ........ 381/340

OTHER PUBLICATIONS

John Murray, NPL publication, "The Quadratic-Throat Waveguide®: A white paper on an invention by Charles E. Hughes of Peavey electronics corporation", 2000.*

Granet, "Optimization of corrugated horns radiation patterns via a spline-profile", 2002.*

Giulio Fedi, NPL Publication, "Profiled Corrugated Circuilar Horns Analysis and Synthesis Via an Artificial Neural Network", 2001.*

Rick C. Morgans, NPL publication, "Fast boundary element models for far field pressure prediction", Nov. 2004.*

Erik Bangtsson, NPL publicatin, "Shape optimization of an acoustic horn", May 2002.*

Mario Di Cola, NPL publication, "Horn's directivity related to the pressure distribution at their mouth", 2000.*

Erik, Bangtsson, NPL, "Shape optimization of an acoustic horn", May 8, 2002.*

JBL, NPL, "Sound system design reference manual", (google) , Jan. 15, 1999.*

* cited by examiner

METHOD OF DESIGNING A SOUND WAVEGUIDE SURFACE

RELATED APPLICATIONS

The present application is a continuation of co-pending U.S. application Ser. No. 11/899,056, filed Sep. 4, 2007, which in turn, claims priority from Australian Provisional Patent Application Serial No. 2006904810, filed on Sep. 4, 2006. Applicants claim priority under U.S.C. §120 as to said U.S. application, and 35 U.S.C. §119 as to the said Australian application, and the entire disclosures of both of said applications is are incorporated herein by reference in their entireties.

TECHNICAL FIELD

The present invention relates to sound generation and reproduction. In a particular form the present invention relates to the design and specification of an acoustic horn or loudspeaker having improved spectral and spatial coverage characteristics.

INCORPORATION BY REFERENCE

The entire contents of each of the following document is hereby incorporated by reference:
R. C. Morgans, *Optimisation Techniques for Horn Loaded Loudspeakers*, PhD Thesis, University of Adelaide, 2004;
P. Kohnke, editor *ANSYS 5.7 Theory Manual*, Ansys Inc, Canonsburg, Pa., 8th edition, 2001
G. H. Koopman and J. B. Fahnline, *Designing Quiet Structures: A Sound Power Minimization Approach*, Academic Press, 1997; and
B. K. Beachkofski and R. V. Grandhi, *Improved Distributed Hypercube Sampling*, 43rd AIAA/ASME/ASCE/AHS/ASC Structures, Structural Dynamics, and Materials Conference, Denver, 2002.

BACKGROUND

The aim of audio reproduction systems is to provide a high quality listening experience and clearly an important component of such a system is the sound delivery system which converts electrical signals to acoustic energy. Acoustic horns are well known sound delivery systems that function to increase sound output by appropriate loading of an electrically stimulated driver unit with the added ability to wholly or partly control the spatial distribution of sound generated by the driver. Typically, an acoustic horn utilises outwardly flaring walls to provide an expanding passage for the acoustic pressure wave between a throat entrance and a mouth exit. The acoustic horn is stimulated by the source driver unit located at the throat entrance which produces the acoustic pressure wave.

Whilst the wall profile of the acoustic horn may be axis-symmetric with an associated cross sectional area that is circular, in many cases the wall profile will have separate horizontal and vertical profiles and associated cross sectional areas which may be elliptical, or rectangular, or develop from one sectional area shape to another as one progresses from the throat to the mouth of the horn. This allows for the design of acoustic horns with well defined beamwidth that will suit a given environmental requirement. The beamwidth, also referred to as the angle of coverage, is defined as the angle formed between the −6 dB points of sound pressure level in the far field as calculated with respect to the central axis reading. As an example, a given environmental requirement might include an acoustic horn having an angle of coverage of 90° in the horizontal plane by 40° in the vertical plane, or 60° by 40°, and so on. Generically acoustic horns of this nature are called constant directivity horns and may be used individually or incorporated into arrays to provide an extended angular coverage.

As such, two important features of an acoustic horn loudspeaker are the beamwidth, whether it be in one or two sectional planes, and the spectral content of the output pressure wave produced by the acoustic horn. Clearly, for asymmetric sound fields independent beamwidths can be determined for different planes of symmetry, in the process independently defining the width of the angle of coverage or the height of the angle coverage of the sound field produced by the acoustic horn. The beamwidth parameter of an acoustic horn also quantifies the amount of sound energy that is transmitted to off-axis regions where the central axis of a horn will be determined by the horn geometry.

With regards to the spectral content of the output pressure wave produced by the horn, this in principle should closely mimic the associated spectral content of the electrical input signal to the driver unit. Another important feature of an acoustic horn related to the beamwidth and spectral content of the output pressure wave is the variation of the beamwidth of the acoustic horn with frequency. Ideally, there should be no variation with frequency; otherwise the spectral content of the sound will vary depending on the location of a listener with respect to the central axis of the acoustic horn.

As is well known, the most important free parameter that may be varied when designing an acoustic horn is the shape of the horn as this shape forms a surface that directs the acoustic pressure wave. Accordingly, one prior art approach in attempting to obtain a sound field of uniform intensity over a desired beamwidth is to join two horn sections with differing cross sectional area growth rates together. The first section, typically employing an exponential area growth rate, provides low frequency loading to the driver and its profile is used to control the width of the sound energy in one plane. At the intersection of the differing area growth rates (called the diffraction slot), sound is diffracted and the intersection essentially becomes a secondary "line source" of sound. The second section, usually employing a conical area growth rate then provides beamwidth control in the second plane. Further flanges can then be added to obtain control over "mid frequency beaming" (a narrowing of the beamwidth at intermediate frequencies) and furthermore vanes can be mounted in the throat of the horn to attempt to obtain control over "high frequency beaming".

However, this approach has a number of serious disadvantages. Whilst a certain amount of control over the beamwidth can be achieved by use of a diffraction slot, this feature itself will also cause multiple reflections of sound waves within the horn, thereby resulting in an irregular frequency response which is easily measured and is perceived as colouration of the sound. Another significant disadvantage is that the sound emitted in the different planes will have different acoustic centres, these being defined by the respective centres of curvatures of the wavefronts of sound formed by the acoustic horn. Accordingly, acoustic horns based on the diffraction slot principle are difficult to incorporate into arrays where the alignment of individual horn components is an important consideration.

There have been a number of attempts to address the disadvantages of designs based on diffraction slots. One approach described in U.S. Pat. No. 6,059,069 relates to a loudspeaker horn having a straight wall section and a curved wall section. The straight wall section has diverging walls defining a coverage angle and the curved wall portion is connected to the straight wall portion at a point tangent thereto, and has a proximal end disposed perpendicular to the plane of the throat entrance. The diverging sidewalls define at least one coverage angle in orthogonal planes having a common apex in the plane of the throat entrance. Whilst this design is able to provide a common acoustic centre, thereby addressing one of the major disadvantages of diffraction slot designs, it only provides a relatively small amount of control of beamwidth in one axis as a function of frequency and this control is limited to only one axis.

US Patent Application No. 2003/0133584 employs an acoustic waveguide with a continuous least-energy-surface formed from an upper vertical control curve, a lower vertical control curve, right horizontal control curve and a left horizontal control curve. In addition, a circular throat end and a non-elliptical closed control curve form a mouth such that the continuous least-energy-surface is coincident with the six control curves. Again this design addresses the problem of providing a common acoustic centre but otherwise gives no guidance as to how a horn design having constant beamwidth as a function of frequency may be achieved.

In US Patent Application No. 2005/0008181, an acoustic waveguide is described that employs surfaces of constant coordinates in two coordinate systems. The coordinate systems chosen are those in which the equation that governs the propagation of sound either in the time domain (i.e. the wave equation, $$\nabla^2 p(\vec{x}, t) - \frac{1}{c^2} \frac{\partial^2 p(\vec{x}, t)}{\partial t^2} = 0,$$

where $p(\vec{x}, t)$ is the acoustic pressure at position $\vec{x}$ and time $t$ and $c$ is the speed of sound) or alternatively in the equivalent frequency domain representation (i.e. the Helmholtz equation, $$\nabla^2 p(\vec{x}) - \frac{\omega^2}{c^2} p(\vec{x}) = 0,$$

where $p(\vec{x})$ is the complex acoustic pressure at position $\vec{x}$ and $\omega$ is the circular frequency) are separable and accordingly yield simplified solutions that depend on single coordinates. For example in a cylindrical coordinate system, a surface of constant radius forms a tube and the propagation of sound down the length of the tube can be considered to depend on axial position only, at least at low frequencies. Another simple example is a spherical coordinate system consisting of the coordinates $(r, \theta, \phi)$ where $r$ is the radius, $\theta$ is the azimuth angle and $\phi$ is the zenith angle. A surface of constant $\phi$ gives a conical horn, and at low enough frequencies the propagation of sound can be considered to depend on $r$ only. The use of a prolate spheroid coordinate system allows independent control of beamwidth but requires a cylindrical vibrating surface as an input. An elliptical cylindrical coordinate system then provides a match between a flat vibrating surface and the prolate spheroid waveguide.

Whilst in principle, horns shaped according to solutions of the Helmholtz equation should result in the beamwidth being independent of frequency the necessarily finite termination of the horn at its mouth will result in diffraction and reflection of the acoustic wave as it leaves the horn. This results in a severe degradation of the performance of the acoustic horn with respect to the constancy of beamwidth with frequency. As is noted in US Patent Application No. 2005/0008181, the outward terminating edge of the horn may be flared to attempt to reduce the variation of beamwidth with frequency. However, this empirical approach does not provide a reliable or systematic method for designing horns that have a desired beamwidth variation as a function of frequency.

It is the object of the present invention to provide a method capable of designing a sound waveguide surface having improved directional characteristics.

It is a further object of the present invention to provide a method capable of designing a sound waveguide surface having a beamwidth that varies with frequency in a predetermined manner.

SUMMARY

In a first aspect the present invention accordingly provides a method for designing a sound waveguide surface, the method including the steps of:

forming a parametric model of the sound waveguide surface, the parametric model having at least one input parameter;

simulating a sound field that is formed by the sound waveguide surface;

determining a frequency dependent spatial distribution measure for the sound field associated with the sound waveguide surface, varying the at least one input parameter to change the sound waveguide surface to adjust the value of the frequency dependent spatial distribution measure.

In another form, the step of varying the at least one input parameter includes varying the at least one input parameter to adjust the frequency dependent spatial distribution measure towards a target criterion.

In another form, the step of varying the at least one input parameter includes determining an objective function characterising the difference between the frequency dependent spatial distribution measure and the target criterion.

In another form, the step of varying the at least one input parameter further includes minimising the objective function to generate a resultant value for the at least one input parameter thereby defining the sound waveguide surface having a frequency dependent spatial distribution measure approaching the target criterion.

In another form, the target criterion for the frequency dependent spatial distribution measure is based on the beamwidth variation of the sound field as a function of frequency.

In another form, the target criterion for the frequency dependent spatial distribution measure is a predetermined variation in the beamwidth as a function of frequency.

Alternatively, the target criterion for the frequency dependent spatial distribution measure is a substantially constant beamwidth as a function of frequency.

Alternatively, the target criterion for the frequency dependent spatial distribution measure is a predetermined constant beamwidth as a function of frequency.

In a second aspect the present invention accordingly provides a sound waveguide surface designed and constructed in accordance with the method of the first aspect of the invention.

In a third aspect the present invention accordingly provides a method for designing an acoustic horn, the method including:

forming a parametric model of the size and shape of the acoustic horn, the parametric model dependent on at least one input parameter;

simulating a sound field corresponding to the size and shape of the acoustic horn;

determining a beamwidth measure of the sound field, the beamwidth measure dependent on frequency and position; and optimising the beamwidth measure with respect to a target criterion by varying the at least one input parameter.

In another form, the target criterion is a predetermined variation in the beamwidth as a function of frequency.

Alternatively, the target criterion is a substantially constant beamwidth as a function of frequency.

Alternatively, the target criterion is a predetermined constant beamwidth as a function of frequency.

In another form, the at least one input parameter includes a horn throat radius, a horn length, and a horn mouth radius.

In another form, the at least one input parameter furthers include a horn profile.

In another form, the horn profile is represented as a spline.

In another form, the acoustic horn is axially symmetric.

In a fourth aspect the present invention accordingly provides an acoustic horn designed and constructed in accordance with the method of the third aspect of the present invention

BRIEF DESCRIPTION OF THE DRAWINGS

Illustrative embodiments of the present invention will be discussed with reference to the accompanying drawings wherein.

DETAILED DESCRIPTION

The following description contains specific information pertaining to the implementation of the present invention. One skilled in the art will recognise that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

Figure 1:
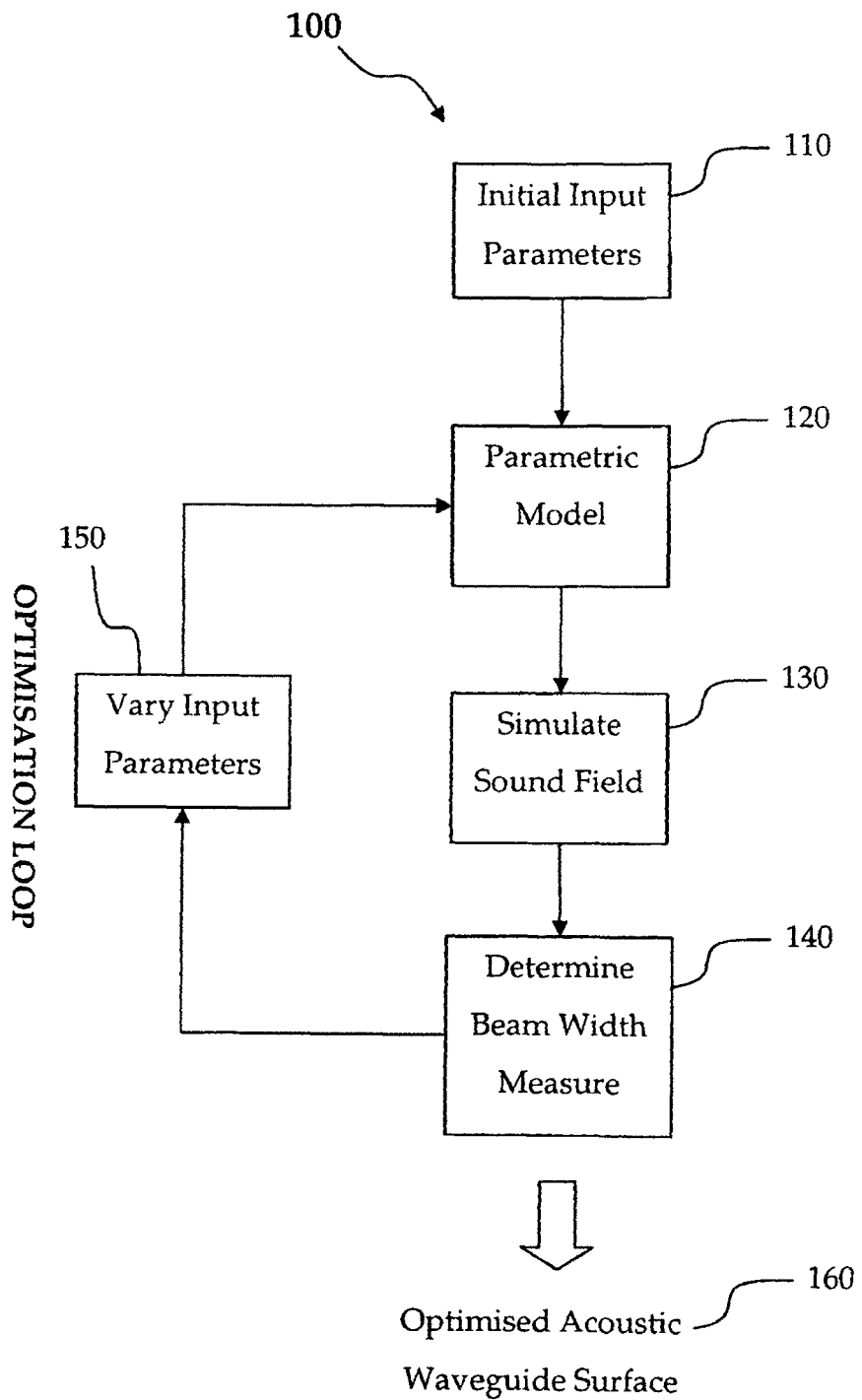
FIG. 1 is a system flowchart depicting the method for designing a sound waveguide surface according to an illustrative embodiment of the present invention.

Referring now to FIG. 1, there is shown a system flowchart of a method 100 for designing a sound waveguide surface according to an illustrative embodiment of the present invention. Throughout the specification the term sound waveguide surface is taken to mean a physical surface having properties capable of altering the directional characteristics of sound energy which interacts with the surface. The sound waveguide surface may also have further physical properties which enhance its absorptive or reflective capabilities as the case may be. Furthermore, the sound waveguide surface may also function in part as a sound emitter.

In overview, method 100 includes the steps of first inputting 110 a number of initial parameters into a parametric model 120 of the sound waveguide surface, the sound field for a parameterised sound waveguide surface is then simulated 130 and from this sound field a beamwidth measure is determined 140. This beamwidth measure relates to the beamwidth of the sound field as a function of frequency and its relationship to a specified dependence of beamwidth with frequency. Once the beamwidth measure is determined 140 the input parameters for the sound waveguide surface are varied 150 and re-inputted into parametric model 120. Method steps 130→140→150→120 are then repeated in an optimisation loop until the beamwidth measure criterion is satisfied resulting in an optimised acoustic waveguide surface 160 designed according to the required beamwidth frequency dependence.

Figure 2:
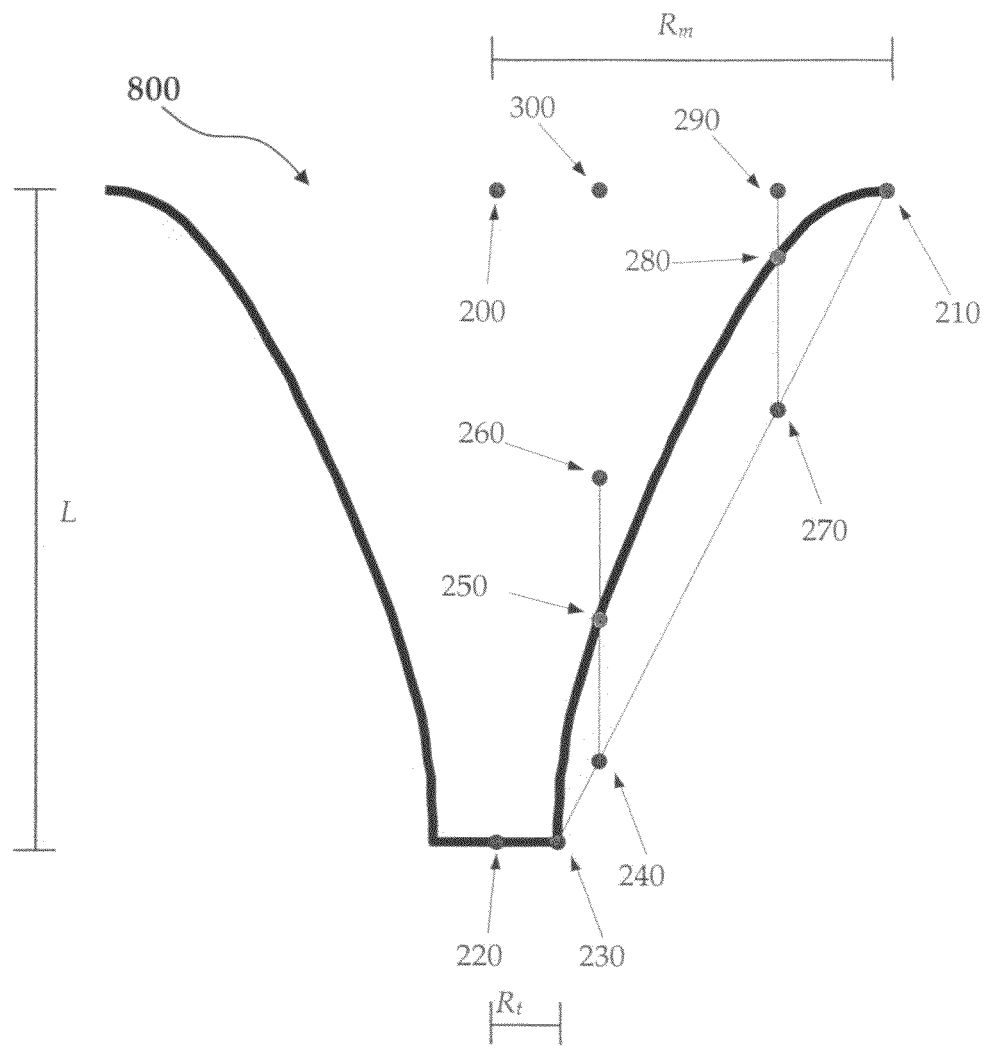
FIG. 2 is a side sectional view of an example waveguide surface geometry employed in an illustrative embodiment of the present invention.

Referring now to FIG. 2, there is shown a sectional profile of the shape of the sound waveguide surface which in this illustrative embodiment is defined as an axially symmetric horn 800. The variation in the shape of the horn 800 is controlled by four independent parameters defined in relation to the horn mouth radius $R_m$ which is the distance between points 200 and 210. The distance $R_m$ is fixed for design purposes and all other parameters (including frequency) are scaled to this dimension. The four independent parameters include:

1. the horn throat radius $R_t$ defined as the distance between points 220 and 230,
2. the horn length L defined as the distance between points 200 and 220,
3. the distance $x_1$ defined as the fractional distance of point 250 along the line between points 240 and 260; and
4. the distance $x_2$ defined as the fractional distance of point 280 along the line between points 270 and 290.

In this illustrative embodiment, the fractional distances of points 240 and 270 along the line between points 230 and 210 are ⅛ and ⅔ respectively.

Point 300 lies vertically in line with point 240 and horizontally in line with point 200. Similarly point 290 lies vertically in line with point 270 and horizontally in line with point 200. Point 260 lies ½ of the distance between point 240 and 300. A spline is fitted through points 230, 250, 280 and 210 and forms the profile of the horn 800. The initial and final slope of the spline at points 230 and 210 can optionally be controlled or be included as free parameters in the optimisation process. In this illustrative embodiment, the initial slope at point 230 or at the throat of the horn 800 is defined to be 90° and the final slope at point 210 or at the mouth of the horn 800 is defined as 0°.

Figure 3:
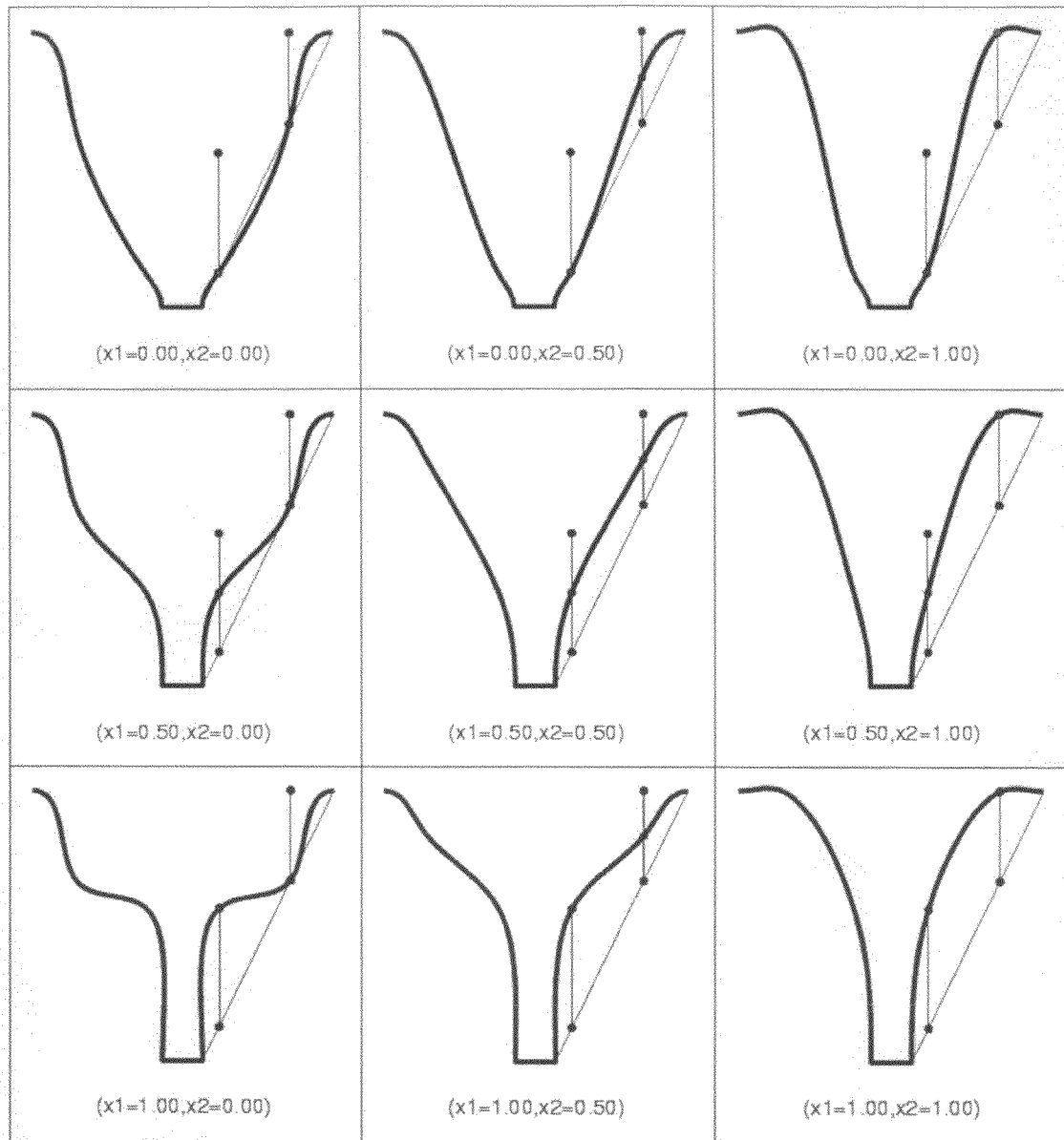
FIG. 3 is a number of side section views of different horn profiles resulting from varying the input parameters of the waveguide surface geometry illustrated in FIG. 2.

In practice any smooth curve formed through points 230, 250, 280 and 210 is sufficient. As depicted in FIG. 3, a variety of horn profiles are achievable via this parameterisation. In this illustrative example the horn dimensional parameters of length L, throat radius $R_t$ and mouth radius $R_m$ are held constant and parameters $x_1$ and $x_2$ are allowed to vary as shown.

In this illustrative embodiment, the ANSYS® APDL command BSPLIN is employed to generate the horn profile. As is well known in the art, ANSYS® is a computational numerical modelling and calculation program that forms part of the standard toolkit of persons skilled in the art. The format of the BSPLIN command is as follows:

BSPLIN, P1, P2, P3, P4, XV1, YV1, ZV1, XV4, YV4, ZV4
where in this embodiment the four points P1, P2, P3 and P4 correspond to the points 230, 250, 280 and 210 and (XV1, YV1, ZV1) corresponds to the initial slope vector at P1 and (XV4, YV4, ZV4) corresponds to the final slope vector at P4. The slope vector is defined generally as being parallel to a vector pointing from the origin of the active coordinate system to the position in space that (XV, YV, ZV) represents in that system (see P. Kohnke, editor *ANSYS 5.7 Theory Manual*, Ansys Inc, Canonsburg, Pa., 8th edition, 2001 whose disclosure is herein incorporated by reference).

Although a BSPLIN representation has been employed to parameterise the acoustic waveguide surface in this illustrative embodiment, it will be clear to those skilled in the art that other parameterisations applicable to more general non symmetric surfaces are contemplated to be within the scope of the invention. As an example, the acoustic waveguide surface might be represented by a bi-cubic spline representation, thereby providing a high degree of freedom of surface manipulation. As would also be appreciated by those skilled in the art, there exist a number of commercial finite element and/or numerical modelling packages that may be employed to generate a horn profile including but not limited to Mathematica™, IMSL™, MathCad™, MathCad™ or IDL™. Equally, the horn profile or parametric model of the sound waveguide surface may be explicitly programmed in a high level language accepting at least one input parameter to parameterise the model.

Referring once again to FIG. 1, the step of simulating the sound field 130 may involve the use of any suitable numerical method that solves the Helmholtz (or Wave) equation including but not limited to techniques such as finite element analysis (FEA) or boundary element methods (BEM). As would be appreciated by those skilled in the art, there are a number of commercial acoustics analysis packages including but not limited to LMS Virtual.Lab™, ARCTRAN™ and Comet Acoustics™, that can be adapted to perform this task or alternatively the chosen numerical method may be explicitly programmed in a high level language.

The geometry of the horn surface or more generally the sound waveguide surface as described by parametric model 120 forms the input surface to the sound field simulator. Suitable boundary conditions representing the driver form further input into the sound field simulator and the relevant equations are then solved to give the sound field at a specified distance and angles located from the horn.

As described previously, FEA is one of a number of general numerical methods that can be used to solve a partial differential equation with appropriate boundary conditions. FEA techniques have been employed in a wide variety of areas to address computational problems in areas such as heat transfer, linear and non-linear solid mechanics, and fluid flow. According to one embodiment of the present invention, the Helmholtz harmonic wave equation, which governs the propagation of linear sound waves, is solved in arbitrary domains with respect to the sound waveguide surface by this method. According to FEA techniques the domain of interest is discretised or "broken up" into a number of smaller "finite" elements, and the underlying differential equation is then approximated over these elements. This process leads to a system of linear equations which are solved after the application of the appropriate boundary conditions to provide a composite solution for the whole domain.

One drawback of FEA in relation to simulating sound fields is that in order for this technique to give accurate results for acoustic problems, the individual finite elements need to be a small fraction of an acoustic wavelength in size. As the frequency considered in any sound field analysis increases the acoustic wavelength decreases. As a consequence, the corresponding number of elements required to accurately model a certain size component increases approximately as the cube of frequency. This results in a significant increase in the computational time required to simulate the sound field.

Accordingly, another technique that may be employed to simulate the sound field is the boundary integral equation method or boundary element method (BEM) as referred to earlier. This is once again a general numerical method for solving the Helmholtz harmonic wave equation that governs the linear acoustic field in arbitrary domains. This technique involves solving a surface integral equation that only requires the bounding surface to be discretised into elements rather than the whole volume being analysed, thereby resulting in a reduced computation burden when compared to FEA techniques. Unlike FEA, which requires the truncation of the discretised domain at a suitable distance away from the horn and the application of suitable radiation boundary conditions to stop reflection occurring at this interface, BEM by its formulation deals implicitly with radiation boundary conditions and there are no special modelling requirements for these conditions.

One approach to employing BEM in sound field simulation tasks is based on numerically approximating the Kirchoff-Helmholtz (K-H) integral equation which is derived from the Helmholtz equation. The K-H integral equation is defined as:

$$c(\vec{x})p(\vec{x}) = -\int_s i\rho\omega v_n(\vec{x}_s)g(\vec{x}_s \mid \vec{x}) + p(\vec{x}_s)\frac{\partial g(\vec{x}_s \mid \vec{x})}{\partial n}ds$$

where
$c(\vec{x})$ is a position dependent constant;
$p(\vec{x})$ is the complex acoustic pressure at the field point $\vec{x}$;
$i=\sqrt{1}$;
$\rho$ is the density of the fluid;
$\omega$ is the circular frequency;
$v_n(\vec{x}_s)$ is the normal velocity on the surface at source position $\vec{x}_s$;

$$g(\vec{x}_s \mid \vec{x}) = \frac{e^{\frac{i\omega R}{c}}}{4\pi R}$$

is the free space Green's function;
c is the speed of sound; and
R is the distance between the source point $\vec{x}_s$ and field point $\vec{x}$.

The K-H integral equation is the fundamental equation of direct BEM, and shows that the pressure at any point can be represented by the surface integral of a combination of monopoles and dipoles. In this equation, the dipole source strength is weighted by the surface pressure. Given a distribution of surface normal velocity, once the surface pressure is found, any pressure field can be calculated.

In the direct BEM method, the variation of pressure on the exterior surface of a volume is discretised with shape functions similar to those used in FEA. If the field point is positioned at each surface node (or "collocated") then a series of $n_n$ equations for the $n_n$ surface pressures can be found for a given velocity distribution. The equations are generated by numerical integration over each element, and the integration technique used must be capable of dealing with the singularities found at the locations of the monopoles and dipoles. The equations can be formed into a matrix and inverted using standard linear algebra techniques. Once the matrix is inverted, and the surface pressures known, the field pressures can be calculated.

In this illustrative embodiment, the technique used to simulate the sound field of the horn is the "source superposition technique" (see for example G. H. Koopman and J. B. Fahnline, *Designing Quiet Structures: A Sound Power Minimization Approach*, Academic Press, 1997, whose disclosure is herein incorporated by reference). This technique is related to traditional BEM, but has the advantage of being very computationally efficient because it requires less computationally expensive numerical integration techniques, and is able to model the thin surfaces typical of horn loaded loudspeakers efficiently, unlike the direct BEM. A detailed description of the BEM employed in this illustrative embodiment is set out in Chapter 5 of R. C. Morgans, *Optimisation Techniques for Horn Loaded Loudspeakers*, PhD Thesis, University of Adelaide, 2004, wherein the disclosure of this PhD thesis is herein incorporated by reference.

Referring once again to FIG. 1, the step of determining a beamwidth measure 140 involves specifying an objective function that quantifies the difference between the desired beamwidth frequency and position dependence properties and those that result from the simulated sound field 130. In this illustrative embodiment, the desired beamwidth behaviour or target criterion is a substantially constant beamwidth with respect to frequency. However, as would be apparent to those skilled in the art, any arbitrary beamwidth function may be employed including a general spatial distribution. Such a general spatial distribution may be directed to a sound field having enhanced coverage properties or alternatively having the sound field incorporate a beamwidth that changes smoothly with frequency in a predetermined manner.

One embodiment of the objective function could be the commonly used least squares objective function, defined as $$S=\Sigma(B(f>f_{min})-B_{nom})^2$$

where B(f) represents the vector of beamwidths calculated using the source superposition technique described above over a range of frequencies defined by the vector f. The operator $f>f_{min}$ selects only those frequencies above $f_{min}$ and $B_{nom}$ is the nominal or desired beamwidth. The minimum frequency $f_{min}$ is chosen to exclude the omnidirectional beamwidth of horns at very low frequencies where the horn mouth will appear essentially as a point source of sound. However, it has been found that this objective function is not smooth and produces many local minima which make optimisation difficult.

In this illustrative embodiment, the objective function S to be minimised is defined as:

$$S = \frac{\Phi_1}{\Phi_2}$$

where $\Phi_1 = \text{std}(B(f>f_{min}))$, and $\Phi_2 = \text{mean}(B(f>f_{min}))$, and where the functions mean(x) and std(x) are the mean and standard deviation of a vector x respectively. This objective function has been shown to vary much more smoothly with input parameters than the least squared objective function and have less local minima. Objective function S can be used in isolation to produce a sound field and hence a horn profile having the least variation of beamwidth over a range of frequencies, this beamwidth also being determined by the optimisation procedure.

Alternatively, as in the case of the least squared objective function described above, further constraints such as requiring $\Phi_2 = B_{nom}$ can be applied to design a horn profile having a predetermined beamwidth which itself varies smoothly over a range of frequencies.

A detailed description of the objective function employed in this illustrative embodiment is set out in Chapter 6 of R. C. Morgans, *Optimisation Techniques for Horn Loaded Loudspeakers*, PhD Thesis, University of Adelaide, 2004.

In another illustrative embodiment, the desired beamwidth may be specified independently in both the vertical and horizontal directions. In this example, the parametric model 120 of the sound waveguide surface may include independent parameterisation for each direction, thereby defining a non-axially symmetric surface. Similarly, the beamwidth measure 140 would include an objective function formed from the combination of individual objective functions $S_i$ calculated for each of the horizontal and vertical directions.

In another embodiment, the beamwidth measure 140 would include an objective function formed from individual objective functions $S_i$ defining the desired beamwidth for a given frequency at different elevations in the sound field. In this manner, a general frequency dependent spatial distribution measure may be defined for the sound field. As would be appreciated by those skilled in the art, as the generality of the frequency dependent spatial distribution measure is increased the number of input parameters required to parameterise the sound waveguide surface will also generally increase.

The next step in designing the sound waveguide surface is the step of varying the input parameters 150 until the desired characteristics of the sound field are achieved by minimising S. In practice this process may use any suitable method of numerical optimisation to systematically vary the input parameters until objective function S is minimised. In general, a function $f(x)$ is said to be globally minimised if a value of $x=x^*$ is found such that $f(x^*) \leq f(x)$ for all x. Most optimisation techniques strive to find a local minimum. This is a point $x=x^*$ defined such that $f(x^*) \leq f(x)$ for $|x-x^*| \leq \delta$ where $\delta>0$ (i.e. for all x in a bounded region near $x^*$). As the objective function S in this illustrative embodiment may contain multiple local minima, a global optimisation technique is preferred.

Standard gradient based optimisation methods such as Sequential Quadratic Programming (SQP) are local optimisation methods and as such often have to be run many times from different starting positions and even then a globally optimum solution is not guaranteed. In addition, gradient information in the form of the derivative of the objective function S with respect to the input parameters is required. In this illustrative embodiment, gradient calculation is difficult for a number of reasons: no simple analytical gradient calculation is possible, a finite difference approximation to this gradient is problematic because of the discrete nature of the meshing used in the source superposition method (a small change in horn profile could lead to a jump in the objective function) and a finite difference gradient evaluation, which can require many calls to the function, is relatively computationally expensive. Accordingly, a gradient free surrogate based global optimisation technique is preferred, such as the Efficient Global Optimisation (EGO) technique.

The EGO technique proceeds as follows. A number of different sets of input parameters are randomly generated to give a representative sample. In this illustrative embodiment, the random samples are generated by Improved Hypercube Sampling (IHS), which attempts to sample points such that the distance between them is close to the optimal spacing for the number of points (see for example B. K. Beachkofski and R. V. Grandhi, *Improved Distributed Hypercube Sampling*, 43rd AIAA/ASME/ASCE/AHS/ASC Structures, Structural Dynamics, and Materials Conference, Denver, 2002, whose disclosure is herein incorporated by reference).

Objective function S is then evaluated for each set of input parameters and a surrogate model is fitted that describes both the variation of the mean value between the sample points and the uncertainty between them. In this embodiment a Kriging technique is used. Kriging techniques, developed in the geostatistics and spatial statistics fields, fit a surface to values from a set of data points. It models the variation of the unknown function as a constant value plus the variation of a normally distributed stochastic variable. It is essentially a method of interpolation between known points that gives a mean prediction in addition to a measure of variability of the prediction. Another appropriate optimisation technique such as SQP, simulated annealing or the DIRECT method is then employed to find the next best place to sample for a minimum objective function. The secondary objective function used in this illustrative embodiment is the Expected Improvement (EI) objective function.

The expected improvement is the expectation of the improvement over the current best point. The improvement I can be given as $$I = \max(g_{min} - \hat{y}(x), 0)$$

where $g_{min}$ is the current best value from the set of samples and $\hat{y}(x)$ is the expected value of a normally distributed continuous random variable at point x (i.e. the mean value of the Kriging prediction at point x). The expected value of the improvement can be calculated as $$E[I] = (g_{min} - \hat{y}(x))\Phi\left(\frac{g_{min} - \hat{y}(x)}{s(x)}\right) + s(x)\phi\left(\frac{g_{min} - \hat{y}(x)}{s(x)}\right)$$

where $\Phi(x)$ is the standard normal cumulative density function;
$\phi(x)$ is the standard normal probability density function; and
$s(x)$ is the estimated standard deviation of the prediction at point x.

The point at which the value of the expected improvement is maximised gives the best point at which to calculate the true objective function. It is constructed to search for both local and global minima.

The surrogate model is then updated to include the newest sampled point, and the operation repeated until the sampling point does not change and the global minimum of the objective function has been found.

A detailed description of the optimisation techniques employed in this illustrative embodiment is set out in Chapter 7 of R. C. Morgans, *Optimisation Techniques for Horn Loaded Loudspeakers*, PhD Thesis, University of Adelaide, 2004, and a general discussion of optimisation is included in Appendix B.

Figure 4:
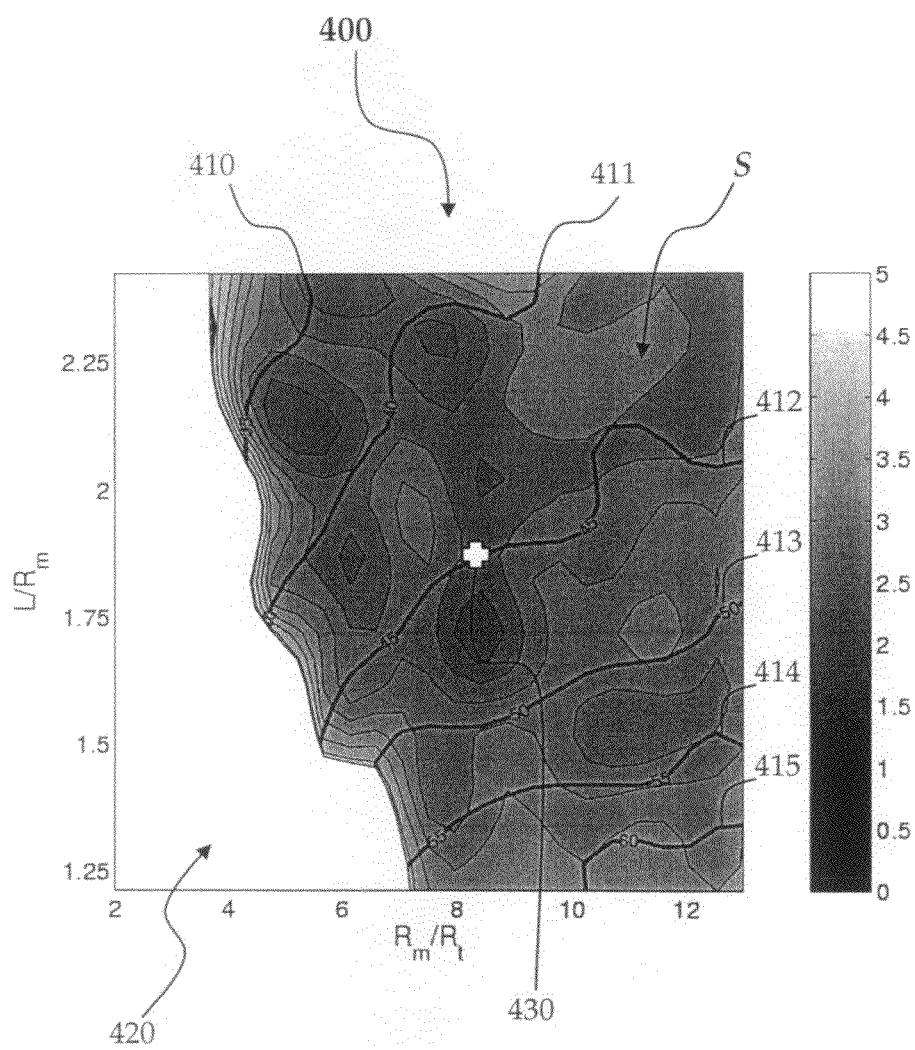
FIG. 4 is a contour map of the value of objective function S as a function of the horn dimension parameters $R_m$, $R_t$ and L.
Figure 5:
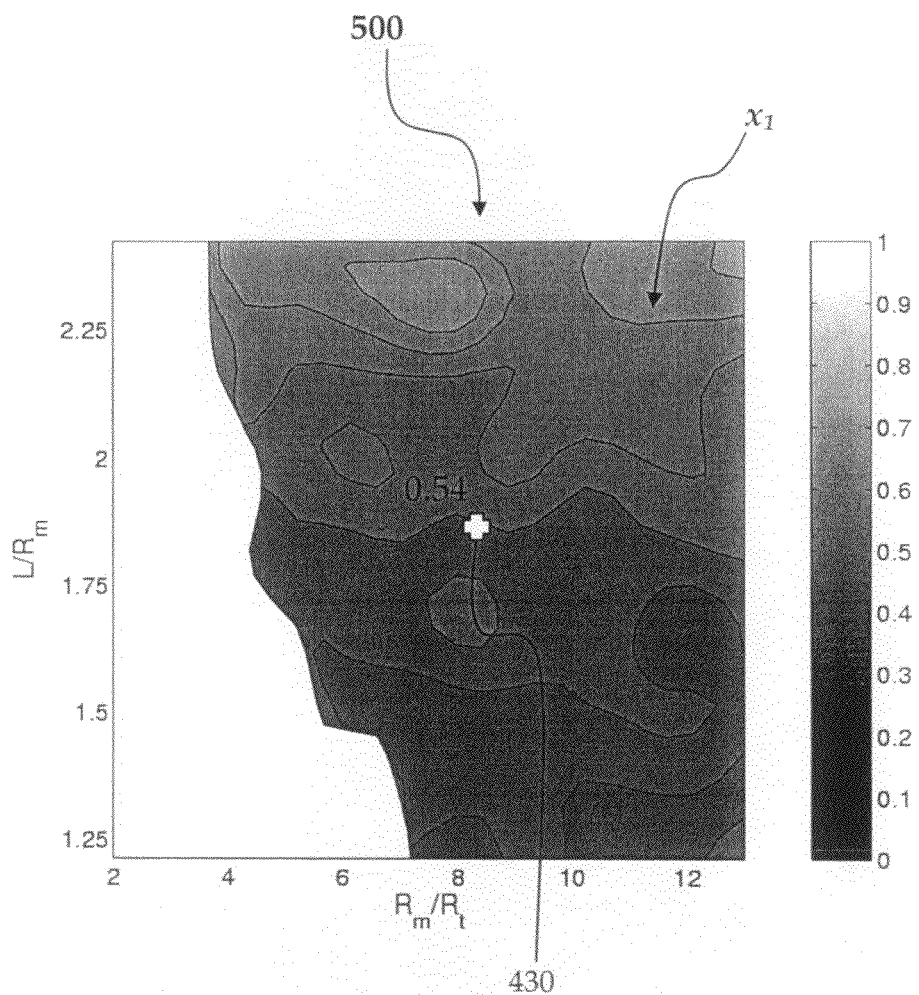
FIG. 5 is a contour map of horn shape parameter $x_1$ as a function of the horn dimension parameters $R_m$, $R_t$ and L.
Figure 6:
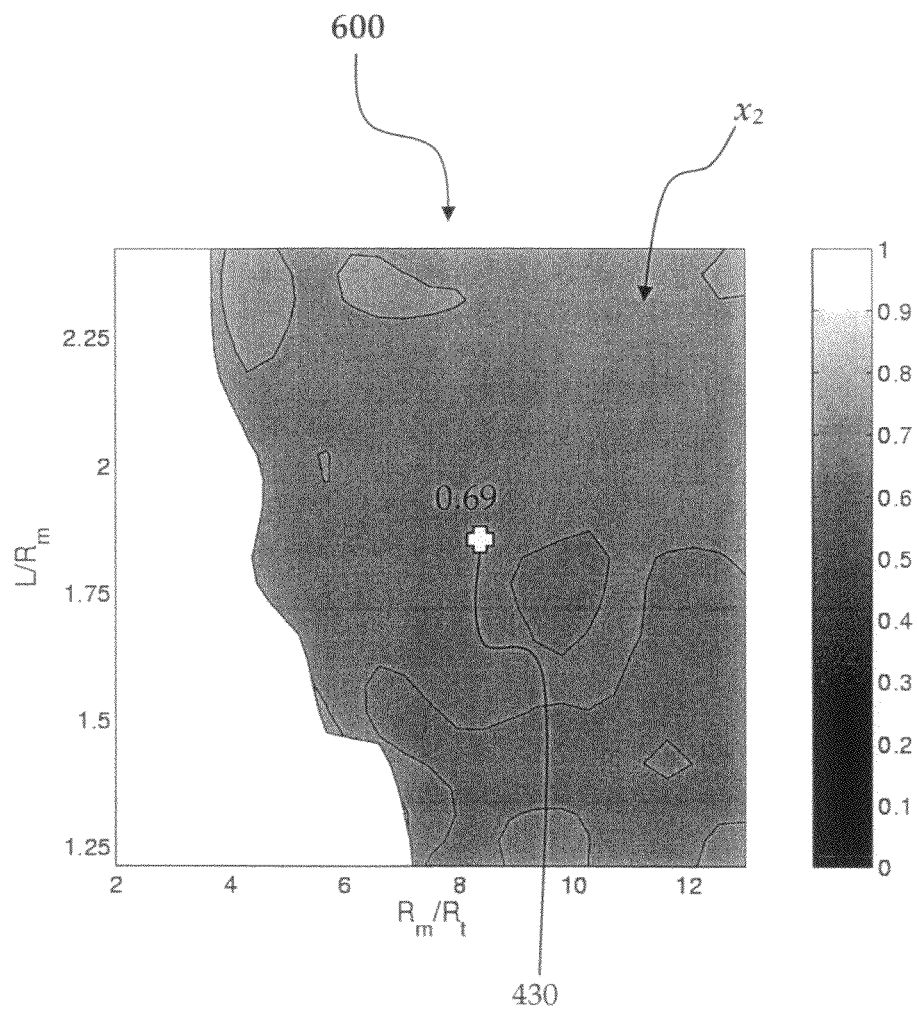
FIG. 6 is a contour map of horn shape parameter $x_2$ as a function of the horn dimension parameters $R_m$, $R_t$ and L.

Referring now to FIGS. 4, 5 and 6, there is shown the results of a series of optimisations according to an illustrative embodiment of the present invention. These results are for a sound waveguide surface which in this illustrative embodiment is a horn having a constant mean beamwidth as a function of frequency as smooth as possible for a given mean beamwidth $\Phi_2$.

In FIG. 4 there is shown a contour map 400 of the objective function S for a range of horn lengths L and throat radii $R_t$ in $R_m$ normalised units, overlayed with contours of constant mean beamwidth $\Phi_2$. Region 420 indicates where input parameters have given results that are not smoothly varying and accordingly region 420 may be ignored. Contours of constant mean beamwidth $\Phi_2$ corresponding to 35° (410), 40° (411), 45° (412), 50° (413), 55° (414) and 60° (415) indicate the regions of contour map 400 which relate to a given constant mean beamwidth $\Phi_2$.

As an example, to select the horn size parameters $R_m$, $R_t$ and L that correspond to the best performance for a given constant mean beamwidth of 45°, the point on the 45° contour line having the minimum value of S is selected. This point is indicated by white cross 430. The horn dimensional parameters can then be simply read from the axes of the contour map 400.

In FIGS. 5 and 6 there are shown respective contour maps 500, 600 of the optimum values of horn shape parameters $x_1$ and $x_2$, which define the shape of the horn as illustrated in FIGS. 2 and 3. These values are simply read from the axes of the respective contour maps 500, 600 for the minimum S location 430 which was previously chosen in FIG. 4. In this case, $x_1 = 0.54$ and $x_2 = 0.69$. In this manner, both the relevant dimensional and shape parameters can be determined for a horn profile having a predetermined constant mean beamwidth. As would be apparent to those skilled in the art, various compromises will be involved in this optimisation process. As an example, a more constant beamwidth as a function of frequency may be possible for a slightly lower overall mean beamwidth than originally desired.

Figure 7:
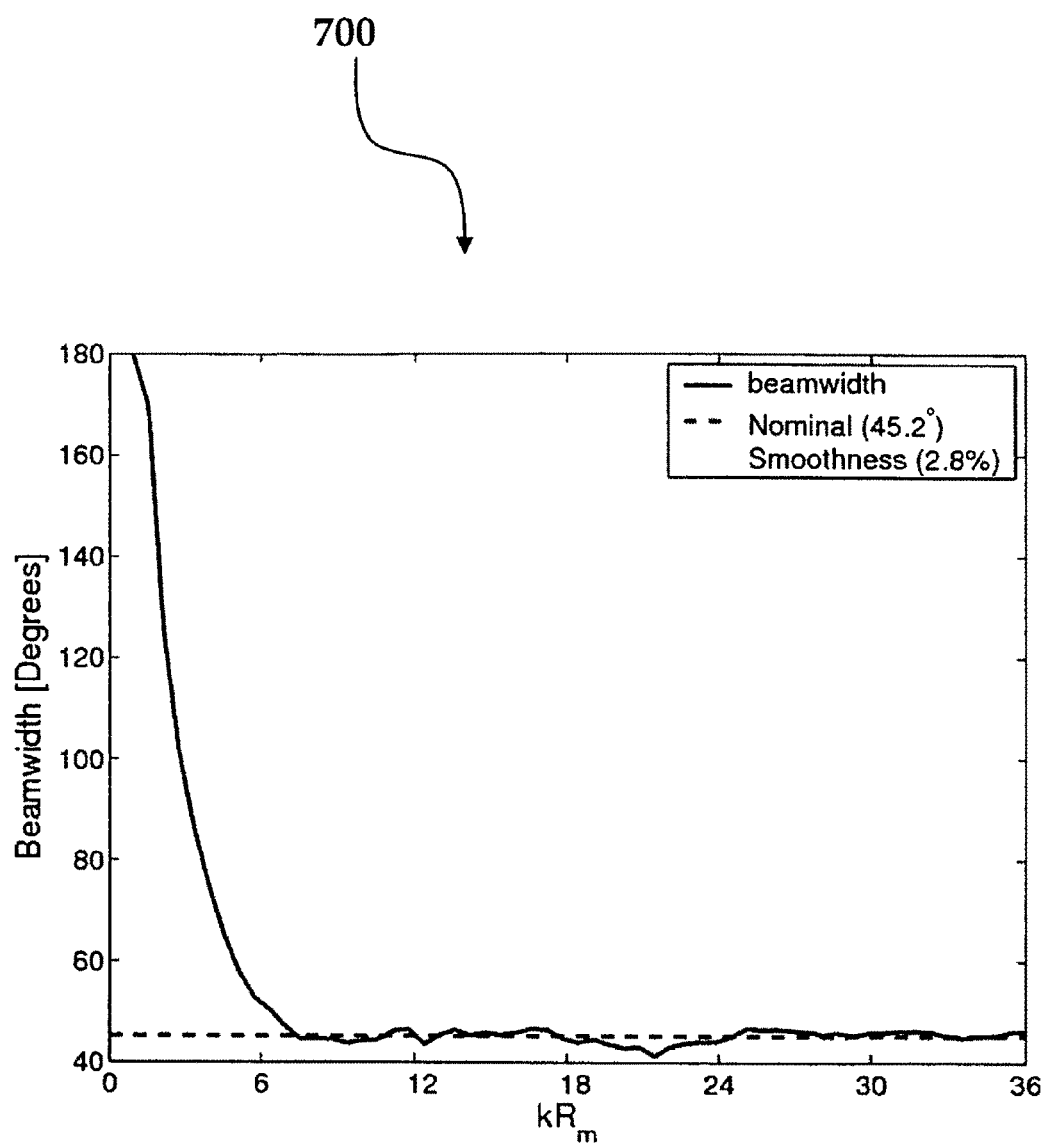
FIG. 7 is a graph of the calculated beam angle versus frequency showing the high degree of smoothness obtained by using parameters selected from FIGS. 4, 5, and 6.

Referring now to FIG. 7, there is shown a graph 700 of simulated beamwidth as a function of normalised frequency $kR_m$ calculated using the values $$\frac{L}{R_m} = 1.87 \text{ and } \frac{R_m}{R_t} = 8.4$$

as read from the axes of FIGS. 4, 5, and 6. Indicated in the top right hand corner of FIG. 7 is the "Smoothness" of the beamwidth as a function of frequency with respect to the design beamwidth 45° which corresponds to the value of the objective function S. As would be appreciated by those skilled in the art, the performance of this profile represents a considerable improvement over the prior art.

A further simplification may be obtained by fitting a simplified linear relationship between the mouth to throat ratio $R_m/R_t$ and normalised length $L/R_m$ for a given desired beamwidth over a range of these values (as best seen in FIG. 4) and then parameterising horn shape parameters $x_1$ and $x_2$ in terms of one of these values. In this manner, for a given throat size $R_t$ or horn length L and desired beamwidth, the remaining size and shape parameters for this beamwidth requirement can be determined.

As an example, these relationships can be parameterised as follows for a horn having a desired beamwidth of 35°.

Variable range:

$$4.2 \leq \frac{R_m}{R_t} \leq 5.6$$

$$2.0 \leq \frac{L}{R_m} \leq 2.4$$

Parameterisation based on mouth to throat ratio $R_m/R_t$:

$$\frac{L}{R_m} = 1.0 + 0.24 \frac{R_m}{R_t}$$

$$x_1 = 0.35 + 0.056 \frac{R_m}{R_t}$$

$$x_2 = 0.72$$

An alternative equivalent parameterisation based on normalised length $L/R_m$:

$$\frac{R_m}{R_t} = -4.3 + 4.2 \frac{L}{R_m}$$

$$x_1 = 0.11 + 0.23 \frac{L}{R_m}$$

$$x_2 = 0.72$$

As would be apparent to those skilled in the art, the parameterisation described above provides an extremely simple method to determine the optimum size and shape of a horn profile for a desired beamwidth.

The previously described embodiments have been directed to audio applications which include those frequencies generally considered to be within the range of human hearing (i.e. 20 Hz to 20 kHz). However, the present invention may also be applied to sound frequencies not necessarily in the audible range. The range of sound frequencies above the audible hearing range (i.e. greater than 20 kHz) is termed the ultrasonic frequency range and there are many applications including medical diagnostics and non destructive testing (NDT) involving the emission and detection of sound in this frequency range.

In one illustrative embodiment, the present invention may be applied to the design of ultrasonic air coupled transducers which are commonly used in NDT applications. As is known in the art, one of the major problems associated with the design of ultrasonic air coupled transducers is the impedance mismatch between air (in the order of 100 Rayl) and any sample liquid or solid that is being investigated which will have an impedance typically in the MegaRayl range. Accordingly, couplants are used to reduce the impedance mismatch in an attempt to reduce the associated high reflection losses. As an example, the total reflection losses from the combined transducer/air interface and air/sample interface may be in the range of 120 dB or greater.

However, the use of couplants involves added complexity in any NDT activity. According to the present invention, the shape of an ultrasonic horn may be designed with the optimisation criterion of minimising the reflection losses at the transducer interface by impedance matching at the horn mouth, thereby increasing the overall efficiency of the associated ultrasonic transducer. These designs can be optimised assuming an air interface or a specified couplant as desired. Furthermore, the horn profile may be optimised to improve the broadband nature of the ultrasound field being generated, in the process allowing a single transducer horn design to be applied over a large frequency range. In this manner, only the piezo element whose resonant mode is typically excited to achieve large sound pressures in an ultrasonic transducer, would need to be changed or actively controlled for different ultrasonic frequency ranges whilst maintaining the same horn design.

Similar considerations apply to ultrasonic transducers used in detection systems such as car alarms, motion detectors, distance sensors and automated car parking systems in that they will also be subject to efficiency losses due to impedance mismatch and internal reflections and be limited to a fixed frequency of operation if used in resonant mode. According to the present invention, the shape of an ultrasonic horn or sound waveguide surface may be designed with the optimisation criterion of minimising the reflection losses at the transducer air interface by impedance matching at the horn mouth, thereby increasing the overall efficiency of the associated ultrasonic transducer. Furthermore, the horn profile may be optimised to also improve the broadband nature of the ultrasound field being generated. This results in a single transducer horn design being able to be applied over a large frequency range and once again only the piezo element whose resonant mode is typically excited to achieve large sound pressures in an ultrasonic transducer, would need to be changed or actively controlled for different ultrasonic frequency ranges whilst maintaining the same horn design.

In another illustrative embodiment of the present invention, the method of designing a sound waveguide surface may be applied to create an anechoic duct termination. These are particularly useful for impedance testing in general and specifically for testing the transmission losses of muffler elements. This will obviate the requirement of having sound absorbent material at the pipe termination of the muffler element which impedes the exhaust flow down the muffler and interferes with testing.

In yet another illustrative embodiment directed to active noise control, horn loaded loudspeakers and/or transducers can be designed with lower reflection losses and improved directional control of the sound field. This combination of features will provide improvements in the capabilities of these devices both in the audio and ultrasonic ranges which can also be extended to arrays of small horn loaded loudspeakers and/or transducers as well.

The steps of a method or algorithm described in connection with the embodiments disclosed herein may be embodied directly in hardware, in a software module executed by a processor, or in a combination of the two. The software module may contain a number of source code or object code segments and may reside in any computer readable medium such as a RAM memory, flash memory, ROM memory; EPROM memory, registers, a hard disk, a removable disk, a CD-ROM, a DVD-ROM or any other form of computer readable medium. In the alternative, the computer readable medium may be integral to the processor. The processor and the computer readable medium may reside in an ASIC.

Although a number of illustrative embodiments of the present invention have been described in the foregoing detailed description, it will be understood that the invention is not limited to the embodiment disclosed, but is capable of numerous rearrangements, modifications and substitutions without departing from the scope of the invention as set forth and defined by the following claims.

The invention claimed is:

1. A method for designing a sound waveguide surface, the method including the steps of:
   forming a parametric model of the sound waveguide surface, the parametric model having at least one input parameter;
   simulating a sound field that is formed by the sound waveguide surface;
   determining a frequency dependent spatial distribution measure for the sound field associated with the sound waveguide surface,
   varying the at least one input parameter to change the sound waveguide surface to adjust the value of the frequency dependent spatial distribution measure.

2. The method for designing a sound waveguide surface as claimed in claim 1, wherein the step of varying the at least one input parameter includes varying the at least one input parameter to adjust the frequency dependent spatial distribution measure towards a target criterion.

3. The method for designing a sound waveguide surface as claimed in claim 2, wherein the step of varying the at least one input parameter includes determining an objective function characterising the difference between the frequency dependent spatial distribution measure and the target criterion.

4. The method for designing a sound waveguide surface as claimed in claim 3, wherein the step of varying the at least one input parameter further includes minimising the objective function to generate a resultant value for the at least one input parameter thereby defining the sound waveguide surface having the frequency dependent spatial distribution measure approaching the target criterion.

5. The method of designing a sound waveguide surface as claimed in claim 4, wherein the target criterion for the frequency dependent spatial distribution measure is based on a beamwidth variation of the sound field as a function of frequency.

6. The method of designing a sound waveguide surface as claimed in claim 5, wherein the target criterion for the frequency dependent spatial distribution measure is a predetermined variation in the beamwidth as a function of frequency.

7. The method of designing a sound waveguide surface as claimed in claim 5, wherein the target criterion for the frequency dependent spatial distribution measure is a substantially constant beamwidth as a function of frequency determined by limiting the objective function to vary less than or equal to 5% from a desired beamwidth.

8. The method of designing the sound waveguide surface as claimed in claim 5, wherein the target criterion for the frequency dependent spatial distribution measure is a predetermined constant beamwidth as a function of frequency.

9. A sound waveguide surface designed and constructed in accordance with the method of claim 1.

10. A method for designing an acoustic horn, the method including:
    forming a parametric model of a size and shape of the acoustic horn, the parametric model dependent on at least one input parameter;
    simulating a sound field corresponding to the size and shape of the acoustic horn;
    determining a beamwidth measure of the sound field, the beamwidth measure dependent on frequency and position; and
    optimising the beamwidth measure with respect to a target criterion by varying the at least one input parameter.

11. The method for designing the acoustic horn of claim 10, wherein the target criterion is a predetermined variation in the beamwidth as a function of frequency.

12. The method for designing the acoustic horn of claim 10, wherein the target criterion is a substantially constant beamwidth as a function of frequency determined by limiting the objective function to vary less than or equal to 5% from a desired beamwidth.

13. The method for designing the acoustic horn of claim 10, wherein the target criterion is a predetermined constant beamwidth as a function of frequency.

14. The method for designing the acoustic horn of claim 10, wherein the at least one input parameter includes a horn throat radius, a horn length, and a horn mouth radius.

15. The method for designing the acoustic horn of claim 11, wherein the at least one input parameter includes a horn throat radius, a horn length, and a horn mouth radius.

16. The method for designing the acoustic horn of claim 12, wherein the at least one input parameter includes a horn throat radius, a horn length, and a horn mouth radius.

17. The method for designing the acoustic horn of claim 14, wherein the at least one input parameter furthers include a horn profile.

18. The method for designing the acoustic horn of claim 17, wherein the horn profile is represented as a spline.

19. The method for designing the acoustic horn of claim 10, wherein the acoustic horn is axially symmetric.

20. An acoustic horn designed and constructed in accordance with the method of claim 10.

* * * * *